(12) United States Patent
Lin et al.

(10) Patent No.: US 7,795,684 B2
(45) Date of Patent: Sep. 14, 2010

(54) ACTIVE DEVICE ARRAY SUBSTRATE

(75) Inventors: Chun-An Lin, Yunlin County (TW);
Wen-Hsiung Liu, Pingtung County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 733 days.

(21) Appl. No.: 11/563,031

(22) Filed: Nov. 24, 2006

(65) Prior Publication Data

US 2008/0123004 A1 May 29, 2008

(51) Int. Cl.
*H01L 29/78* (2006.01)

(52) U.S. Cl. ............... 257/355; 257/356; 257/E29.273; 257/E29.008; 349/40

(58) Field of Classification Search .................. 257/356
See application file for complete search history.

(56) References Cited

U.S. PATENT DOCUMENTS 5,936,687 A    8/1999  Lee
6,108,057 A    8/2000  Kusanagi
6,538,708 B2   3/2003  Zhang
6,791,632 B2   9/2004  Lee et al.
6,839,097 B2 * 1/2005  Park et al. ...................... 349/40
7,439,589 B2 * 10/2008 Lai ............................ 257/355

* cited by examiner

*Primary Examiner*—Jerome Jackson, Jr.
(74) *Attorney, Agent, or Firm*—Jianq Chyun IP Office

(57) ABSTRACT

An active device array substrate including a substrate, a plurality of pixel units, a plurality of first conductive lines, a plurality of second conductive lines, a lead line, at least one first electrostatic discharge protection circuit, and at least one second electrostatic discharge protection circuit is provided. The pixel units are arranged on the substrate. Additionally, the first conductive lines and the second conductive lines are disposed on the substrate and electrically connected to the pixel units respectively. Moreover, the lead line crosses the first conductive lines. The first electrostatic discharge protection circuit is disposed at one side of the lead line, and the second electrostatic discharge protection circuit corresponding to the first electrostatic discharge protection circuit is disposed at the other side of the lead line.

8 Claims, 6 Drawing Sheets

ACTIVE DEVICE ARRAY SUBSTRATE

BACKGROUND OF THE INVENTION

1. Field of Invention

The present invention relates to an active device array substrate. More particularly, the present invention relates to an active device array substrate having an electrostatic discharge (ESD) protection function.

2. Description of Related Art

In the fabrication of liquid crystal displays, operators, machines, or testing instruments are prone to carry static electricity. When the above charge-carrying entities (operators, machines, or testing instruments) contact a liquid crystal display panel, the devices and circuits inside the liquid crystal display panel may be damaged by ESD. Therefore, ESD protection circuits are usually designed in the peripheral circuit region of the liquid crystal display panel. As for active matrix liquid crystal display panels, the ESD protection circuits are generally formed on the substrate during the fabrication of the active device array, and the active device arrays are electrically connected to the ESD protection circuits. As such, when the liquid crystal display panel is impacted by ESD, the ESD protection circuits can dissipate or alleviate the static electricity, so as to prevent the static electricity from directly impacting the devices and circuits inside the display region.

FIG. 1 is a schematic view of a conventional active device array substrate. Referring to FIG. 1, an active device array substrate 110 has a display region A and a peripheral circuit region B. The active device array substrate 110 mainly comprises a substrate 112, a plurality of scan lines 114, a plurality of data lines 116, a plurality of pixel units 118, a lead line 120, a plurality of ESD protection devices 122, and a plurality of pads 124. The scan lines 114 and data lines 116 are disposed on the substrate 112, and the pixel units 118 are disposed in the display region A. In particular, the scan lines 114 and data lines 116 are electrically connected to the pixel units 118, and voltage signals can be transmitted to the pixel units 118 through the scan lines 114 and data lines 116. In addition, the scan lines 114 and the data lines 116 are electrically connected to the corresponding pads 124 respectively.

As shown in FIG. 1, the lead line 120 is disposed in the peripheral circuit region B, and electrically connected to one end of the respective ESD protection devices 122. The other end of the respective ESD protection devices 122 is electrically connected to the corresponding scan lines 114 and data lines 116. In particular, when the ESD phenomenon occurs on the substrate 112, the electrostatic charges are dispersed through the lead line 120, thus avoiding the accumulation of electrostatic charges. In another aspect, the ESD protection device 122 consumes the energy of the electrostatic charges to alleviate the ESD impact.

It should be noted that, the lead line 120 crosses the scan lines 114 and the data lines 116. When the ESD phenomenon occurs at the pads 124, the static electricity can directly pass through a cross line position C, which may easily induce the electrostatic discharging at the cross line position C, thus causing short of the lead line 120 and the scan lines 114 (data lines 116). As a result, the production yield is reduced and the manufacturing cost is increased, so it is necessary to improve the conventional art.

SUMMARY OF THE INVENTION

Accordingly, an objective of the present invention is to provide an active device array substrate, so as to solve the problem existing in the conventional art that short caused by ESD easily occur to the active device array substrate.

In order to achieve the above or other objectives, the present invention provides an active device array substrate, which has a display region and a peripheral circuit region outside the display region. The active device array substrate of the present invention comprises a substrate, a plurality of pixel units, a plurality of first conductive lines, a plurality of second conductive lines, a lead line, at least one first ESD protection circuit, and at least one second ESD protection circuit. The pixel units are arranged on the substrate and inside the display region. Additionally, the first conductive lines and the second conductive lines are disposed inside the peripheral circuit region on the substrate. The first conductive lines and the second conductive lines extend from the peripheral circuit region and are electrically connected to the pixel units respectively. The lead line is disposed inside the peripheral circuit region and crosses the first conductive lines, thereby defining two sides. Moreover, the first electrostatic discharge protection circuit is disposed at one side of the lead line, and is electrically connected between any one of the first conductive lines and the lead line. The second electrostatic discharge protection circuit corresponding to the first electrostatic discharge protection circuit is disposed at the other side of the lead line, and is electrically connected to the same first conductive line that the first ESD protection circuit is connected to. The second ESD protection circuit is electrically connected to the first ESD protection circuit through the lead line.

In an embodiment of the present invention, the first ESD protection circuit comprises a first active device, a second active device, a third active device, and a fourth active device. The first active device comprises a first source, a first drain, and a first gate. The first source and the first gate are electrically connected to the first conductive line. The second active device comprises a second source, a second drain, and a second gate. The second source and the second gate are electrically connected to the first drain, and the second drain is electrically connected to the lead line. The third active device comprises a third source, a third drain, and a third gate. The third source and the third gate are electrically connected to the lead line. The fourth active device comprises a fourth source, a fourth drain, and a fourth gate. The fourth source and the fourth gate are electrically connected to the third drain, and the fourth drain is electrically connected to the first conductive line.

In an embodiment of the present invention, the second ESD protection circuit comprises a fifth active device, a sixth active device, a seventh active device, and an eighth active device. The fifth active device comprises a fifth source, a fifth drain, and a fifth gate. The fifth source and the fifth gate are electrically connected to the first conductive line. The sixth active device comprises a sixth source, a sixth drain, and a sixth gate. The sixth source and the sixth gate are electrically connected to the fifth drain, and the sixth drain is electrically connected to the lead line. The seventh active device comprises a seventh source, a seventh drain, and a seventh gate. The seventh source and the seventh gate are electrically connected to the lead line. The eighth active device comprises an eighth source, an eighth drain, and an eighth gate. The eighth source and the eighth gate are electrically connected to the seventh drain, and the eighth drain is electrically connected to the first conductive line.

In an embodiment of the present invention, the first ESD protection circuit is electrically connected between two adjacent first conductive lines, and the first ESD protection circuit comprises a first active device, a second active device, and a third active device. The first active device comprises a first source, a first drain, and a first gate. The first source and the first gate are electrically connected to the first conductive line. The second active device comprises a second source, a second drain, and a second gate. The second source and the second gate are electrically connected to the first drain, and the second drain is electrically connected to the lead line. The third active device comprises a third source, a third drain, and a third gate. The third drain is electrically connected to the second gate, and the third source and the third gate are electrically connected to the next first conductive line.

In an embodiment of the present invention, the second ESD protection circuit is electrically connected between two adjacent first conductive lines, and the second ESD protection circuit comprises a fourth active device, a fifth active device, and a sixth active device. The fourth active device comprises a fourth source, a fourth drain, and a fourth gate. The fourth drain is electrically connected to the first conductive line. The fifth active device comprises a fifth source, a fifth drain, and a fifth gate. The fourth source and the fourth gate are electrically connected to the fifth drain, and the fifth source and the fifth gate are electrically connected to the lead line. The sixth active device comprises a sixth source, a sixth drain, and a sixth gate. The sixth source and the sixth gate are electrically connected to the fifth drain, and the sixth drain is electrically connected to the next first conductive line.

In an embodiment of the present invention, the aforementioned first conductive lines are scan lines and the aforementioned second conductive lines are data lines.

In an embodiment of the present invention, the first source of the first active device extends crossing the first conductive line, so as to form a first cross line portion.

In an embodiment of the present invention, the third source of the third active device extends crossing the next first conductive line, so as to form a second cross line portion.

In an embodiment of the present invention, the aforementioned first conductive lines are data lines and the aforementioned second conductive lines are scan lines.

In an embodiment of the present invention, the first gate of the first active device extends and is crossed by a first conductive line, so as to form a third cross line portion.

In an embodiment of the present invention, the third gate of the third active device extends and is crossed by the next first conductive line, so as to form a fourth cross line portion.

In the active device array substrate of the present invention, the first ESD protection circuit and the second ESD protection circuit are respectively disposed at both sides of the lead line, such that the position that the lead line crosses the first conductive line is located between the first ESD protection circuit and the second ESD protection circuit. Therefore, when the ESD phenomenon occurs, the electrostatic charges first pass through the first ESD protection circuit or the second ESD protection circuit, and then through the position that the lead line crosses the first conductive line. As such, the short caused by ESD at the position that the lead line crosses the first conductive line can be effectively prevented.

In order to make the aforementioned and other objectives, features and advantages of the present invention comprehensible, preferred embodiments accompanied with figures are described in detail below.

DESCRIPTION OF EMBODIMENTS

The First Embodiment

Figure 1:
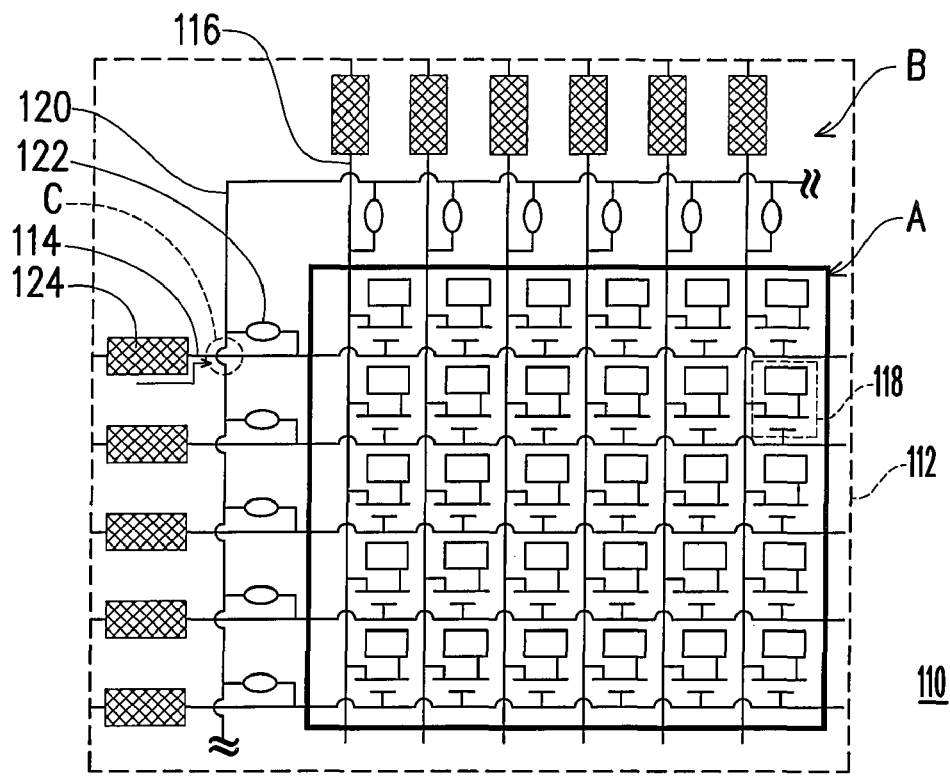
FIG. 1 is a schematic view of a conventional active device array substrate.
Figure 2:
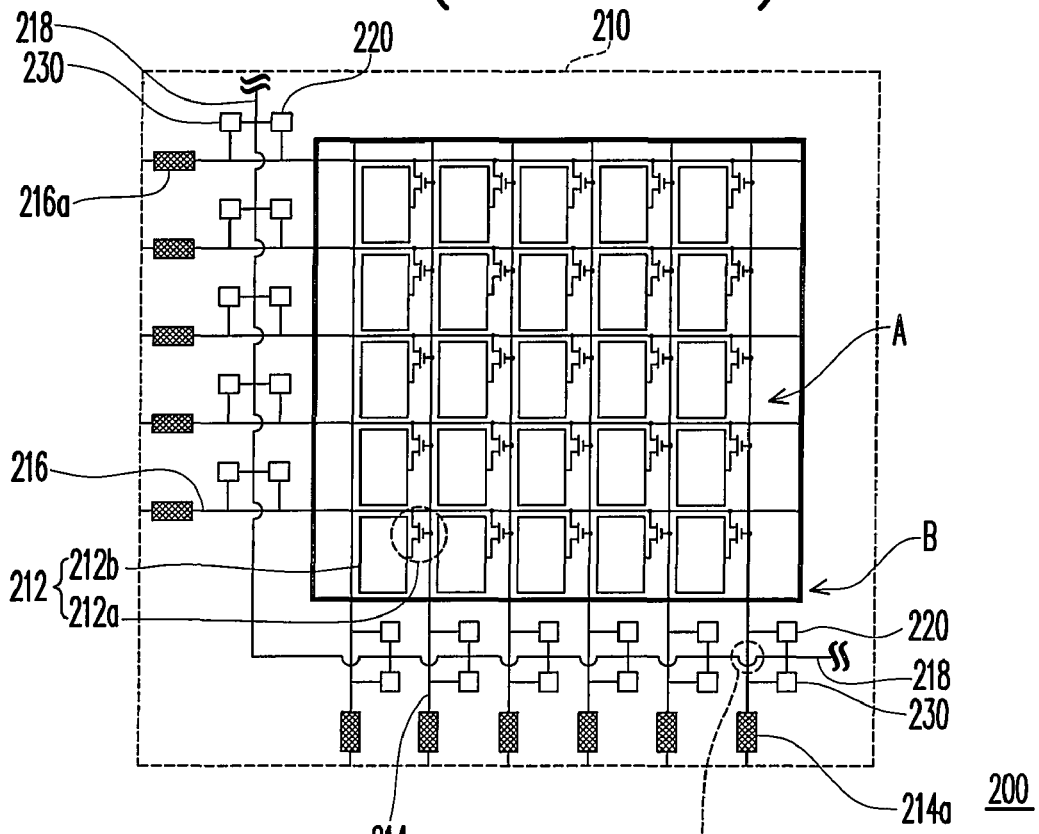
FIG. 2 is a schematic view of the active device array substrate according to the first embodiment of the present invention.

FIG. 2 is a schematic view of the active device array substrate according to the first embodiment of the present invention. Referring to FIG. 2, an active device array substrate 200 of the present invention comprises a display region A and a peripheral circuit region B outside the display region A. In particular, the active device array substrate 200 of the present invention comprises a substrate 210, a plurality of pixel units 212, a plurality of first conductive lines 214, a plurality of second conductive lines 216, a lead line 218, at least one first ESD protection circuit 220, and at least one second ESD protection circuit 230. The pixel units 212 are arranged on the substrate 210 in an array and disposed inside the display region A. The first conductive lines 214 and the second conductive lines 216 define the positions of the pixel units 212.

Generally speaking, each of the pixel units 212 comprises at least one active device 212a and a pixel electrode 212b, wherein the active device 212a is electrically connected to the pixel electrode 212b. It should be noted that the number of the active device 212a depends on the design of the pixel unit 212. For example, a pixel unit 212 having the pre-charge design requires at least two active devices 212a. Thus, the number of the active device 212a in each pixel unit 212 is not limited herein.

In particular, one end of the first conductive lines 214 and the second conductive lines 216 in the peripheral circuit region B extends into the display region A and is electrically connected to the pixel units 212. In another aspect, the other end of the first conductive lines 214 and the second conductive lines 216 are connected to a first pad 214a and a second pad 216a. In the present embodiment, for example, the first conductive lines 214 are scan lines, and the second conductive lines 216 are data lines. The first conductive line 214 is electrically connected to the gate of the active device 212a, and the second conductive line 216 is electrically connected to the source of the active device 212a. In practice, a switch signal transmitted through the first conductive line 214 turns on the active device 212a. Further, after the active device 212a is turned on, a display signal is transmitted to the pixel electrode 212b through the second conductive line 216.

Figure 3:
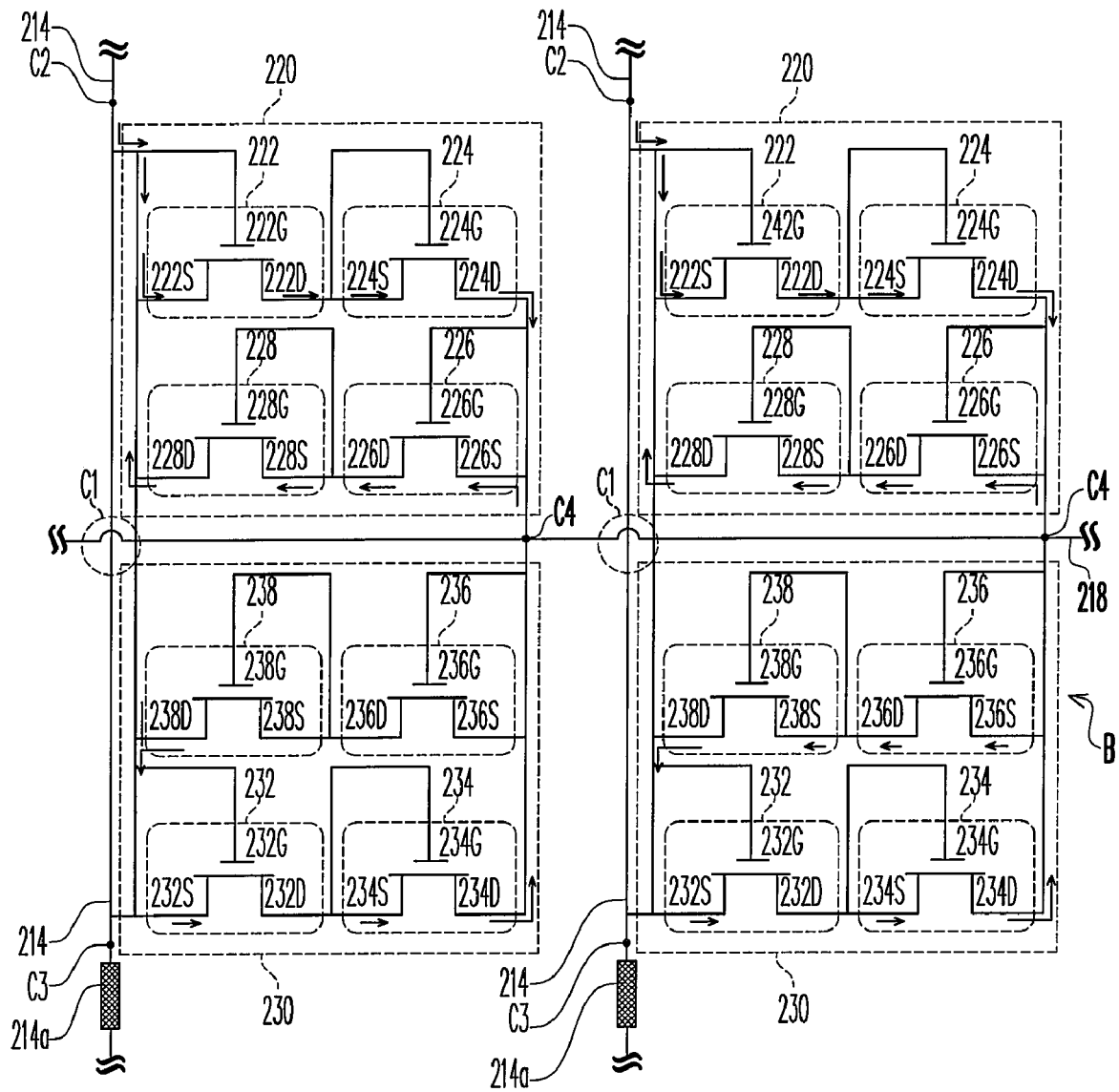
FIG. 3 is a schematic circuit diagram of the ESD protection circuit according to the first embodiment of the present invention.

FIG. 3 is a schematic circuit diagram of the ESD protection circuit according to the first embodiment of the present invention. Referring to FIGS. 2 and 3, the lead line 218 is disposed in the peripheral circuit region B, and crosses the first conductive lines 214, thus defining two sides. The first ESD protection circuit 220 of the present invention is disposed at one side of the lead line 218, and electrically connected between the first conductive line 214 and the lead line 218. It should be noted that the second ESD protection circuit 230 of the present invention corresponding to the first ESD protection circuit 220 is disposed at the other side of the lead line 218 corresponding to the first ESD protection circuit 220. In other words, the first ESD protection circuit 220 and the second ESD protection circuit 230 are respectively disposed at two sides of the lead line 218. In particular, the second ESD protection circuit 230 is electrically connected to the first ESD protection circuit 220 via the lead line 218, and the first ESD protection circuit 220 and the second ESD protection circuit 230 are electrically connected to the same first conductive line 214.

In particular, when the ESD phenomenon occurs at C2 of the first conductive line 214 (as shown in FIG. 3), a portion of the electrostatic charges is dispersed by the first ESD protection circuit 220, so as to alleviate the impact of ESD. In addition, after flowing into the first ESD protection circuit 220, the electrostatic charges are dispersed by the lead line 218, so as to prevent excessive electrostatic charges accumulating on the substrate 210. As the electrostatic charges from C2 are firstly dispersed and consumed by the first ESD protection circuit 220, the cross line position C1 of the first conductive line 214 and the lead line 218 can be prevented from being directly impacted by ESD, thereby effectively preventing the short occurring at the cross line position C1 of the first conductive line 214 and the lead line 218.

In another aspect, when the ESD phenomenon occurs at C3 (adjacent to the first pad 214a) of the first conductive line 214, a portion of the electrostatic charges is firstly dispersed by the second ESD protection circuit 230. After that, the electrostatic charges pass through the cross line position C1 of the first conductive line 214 and the lead line 218. As the cross line position C1 of the first conductive line 214 and the lead line 218 is located between the first ESD protection circuit 220 and the second ESD protection circuit 230, the first ESD protection circuit 220 and the second ESD protection circuit 230 can effectively prevent the cross line position C1 from being directly damaged by ESD.

Moreover, when the ESD phenomenon occurs at C4 of the lead line 218, a portion of the electrostatic charges on the lead line 218 is firstly dispersed by the first ESD protection circuit 220 and the second ESD protection circuit 230, thus effectively preventing the cross line position C1 of the first conductive line 214 and the lead line 218 from being directly damaged by ESD. As a whole, the electrostatic charges on the lead line 218 can be dispersed to the first conductive line 214 through the first ESD protection circuit 220 and the second ESD protection circuit 230, and the electrostatic charges on the first conductive line 214 are dispersed to the lead line 218 through the first ESD protection circuit 220 and the second ESD protection circuit 230. Therefore, besides providing more electrostatic dispersion paths, the first ESD protection circuit 220 and the second ESD protection circuit 230 of the present invention also have the bi-directional conduction function. Compared with the conventional art, the active device array substrate 200 of the present invention has a better ESD protection effect.

Again referring to FIG. 3, in particular, the first ESD protection circuit 220 of the present invention comprises a first active device 222, a second active device 224, a third active device 226, and a fourth active device 228. The above active devices can be fabricated together with the active device 212a of the pixel unit 212 (as shown in FIG. 2), thus saving the additional mask process. In practice, the active devices can be thin film transistors. In particular, the first active device 222 comprises a first source 222S, a first drain 222D, and a first gate 222G. The first source 222S and the first gate 222G are electrically connected to the first conductive line 214. In addition, the second active device 224 comprises a second source 224S, a second drain 224D, and a second gate 224G. The second source 224S and the second gate 224G are electrically connected to the first drain 222D, and the second drain 224D is electrically connected to the lead line 218.

When the ESD phenomenon occurs at C2 (adjacent to one end of the display region A), the high voltage instantly generated by ESD turns on the first active device 222, such that the electrostatic charges flow from the first source 222S to the first drain 222D. In practice, after turning on the first active device 222, the energy of the electrostatic charges is effectively consumed, thus alleviating the damage of ESD. If the energy of ESD is great, the second active device 224 can be used to alleviate the damage of ESD again. Then, the electrostatic charges are dispersed by the lead line 218, so as to further alleviate the impact of ESD. It should be noted that if the short caused by ESD occur to either the first active device 222 or the second active device 224, the other undamaged active device can still operate normally. Therefore, the first ESD protection circuit 220 still has the function of electrostatic dispersion instead of complete failure.

Furthermore, the third active device 226 in the first ESD protection circuit 220 comprises a third source 226S, a third drain 226D, and a third gate 226G. The third source 226S and the third gate 226G are electrically connected to the lead line 218. In addition, the fourth active device 228 comprises a fourth source 228S, a fourth drain 228D, and a fourth gate 228G. The fourth source 228S and the fourth gate 228G are electrically connected to the third drain 226D, and the fourth drain 228D is electrically connected to the first conductive line 214.

When the ESD phenomenon occurs at C4 of the lead line 218, a portion of the static electricity flows through the first ESD protection circuit 220 and the second ESD protection circuit 230 (illustrated in detail hereinafter). The electrostatic charges flowing through the first ESD protection circuit 220 can sequentially turn on the third active device 226 and the fourth active device 228, so as to achieve the purpose of consuming energy. In another aspect, the electrostatic charges can be dispersed to the first conductive line 214 through the third active device 226 and the fourth active device 228. Likewise, if the short caused by ESD occurs to either the third active device 226 or the fourth active device 228, the first ESD protection circuit 220 still has the function of electrostatic dispersion instead of complete failure.

The second ESD protection circuit 230 of the present invention corresponding to the first ESD protection circuit 220 is disposed at the other side of the lead line 218. The second ESD protection circuit 230 comprises a fifth active device 232, a sixth active device 234, a seventh active device 236, and an eighth active device 238. The above active devices can be fabricated together with the active device 212a of the pixel unit 212 (as shown in FIG. 2), thus saving the additional mask process.

In particular, the fifth active device 232 comprises a fifth source 232S, a fifth drain 232D, and a fifth gate 232G. The fifth source 232S and the fifth gate 232G are electrically connected to the first conductive line 214. Moreover, the sixth active device 234 comprises a sixth source 234S, a sixth drain 234D, and a sixth gate 234G. The sixth source 234S and the sixth gate 234G are electrically connected to the fifth drain 232D, and the sixth drain 234D is electrically connected to the lead line 218. When the ESD phenomenon occurs at C3 of the first conductive line 214 (adjacent to one end of the first pad 214a), the static electricity can sequentially turn on the fifth active device 232 and the sixth active device 234. After that, the static electricity is dispersed by the lead line 218.

Further, the seventh active device 236 in the second ESD protection circuit 230 comprises a seventh source 236S, a seventh drain 236D, and a seventh gate 236G. The seventh source 236S and the seventh gate 236G are electrically connected to the lead line 218. In addition, the eighth active device 238 comprises an eighth source 238S, an eighth drain 238D, and an eighth gate 238G. The eighth source 238S and the eighth gate 238G are electrically connected to the seventh drain 236D, and the eighth drain 238D is electrically connected to the first conductive line 214.

When the ESD phenomenon occurs at C4 of the lead line 218, the electrostatic charges are dispersed by the first ESD protection circuit 220 and the second ESD protection circuit 230. A portion of the electrostatic charges, when passing through the second ESD protection circuit 230, can sequentially turn on the seventh active device 236 and the eighth active device 238, so as to achieve the purpose of consuming the energy of the static electricity. Then, the electrostatic charges can be dispersed to the first conductive line 214 through the seventh active device 236 and the eighth active device 238, thereby further dispersing the static electricity to alleviate the impact of ESD.

In order to further enhance the ESD protection function of the active device array substrate 200 of the present invention, the first ESD protection circuit 220 and the second ESD protection circuit 230 can also be applied to the second conductive line 216 (as shown in FIG. 2). In particular, the first ESD protection circuit 220 and the second ESD protection circuit 230 at the second conductive line 216 are respectively disposed at two sides of the lead line 218, and are electrically connected between the second conductive line 216 and the lead line 218. In addition, the first ESD protection circuit 220 and the second ESD protection circuit 230 are electrically connected to each other via the lead line 218. As such, the first ESD protection circuit 220 and the second ESD protection circuit 230 can effectively prevent the direct impact of ESD on the cross line position of the second conductive line 216 and the lead line 218.

The Second Embodiment

The second embodiment is similar to the first embodiment, and the difference lies in that in the present embodiment, the first ESD protection circuit and the second ESD protection circuit are electrically connected between two adjacent first conductive lines.

Figure 4:
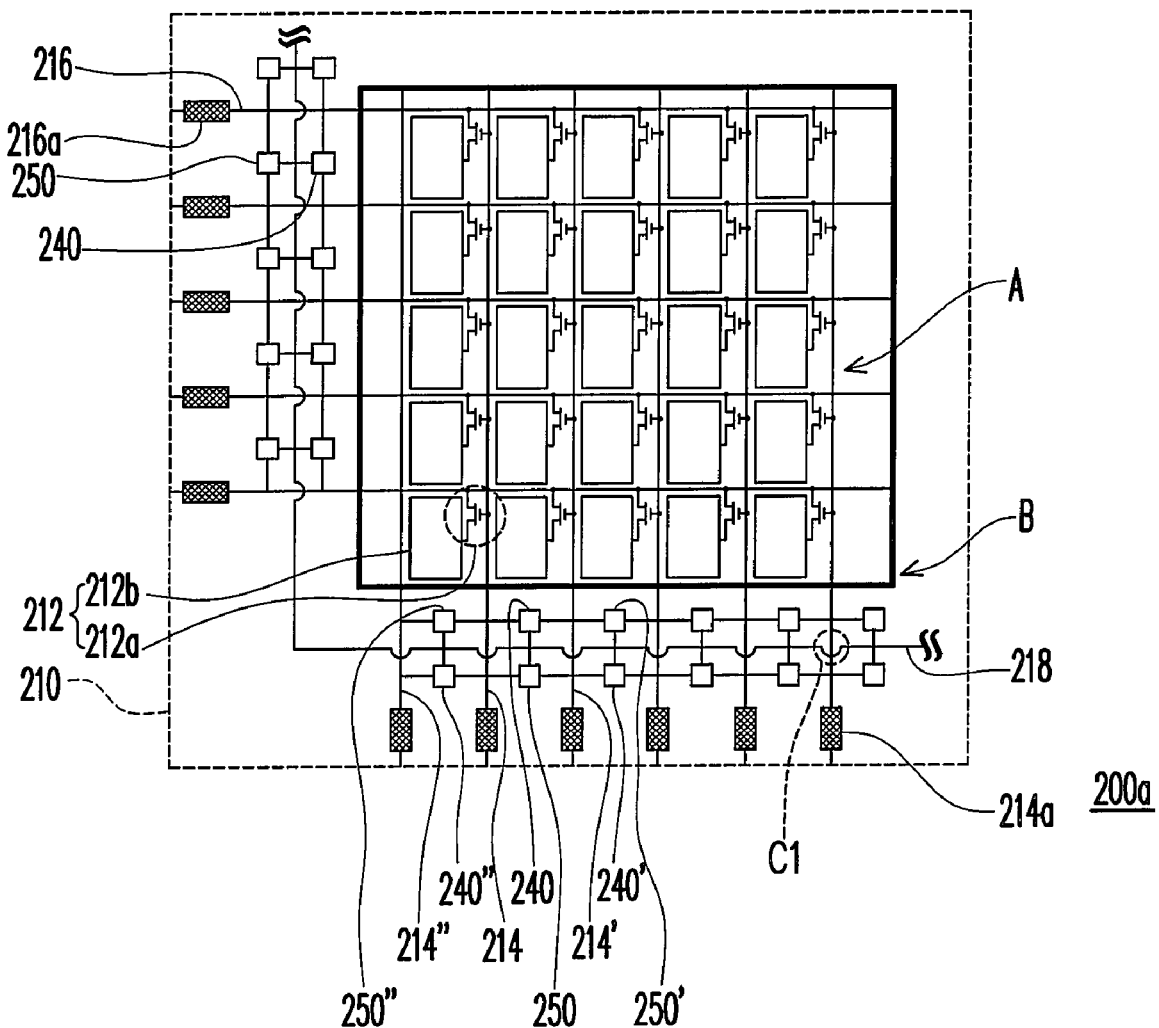
FIG. 4 is a schematic view of the active device array substrate according to the second embodiment of the present invention.
Figure 5:
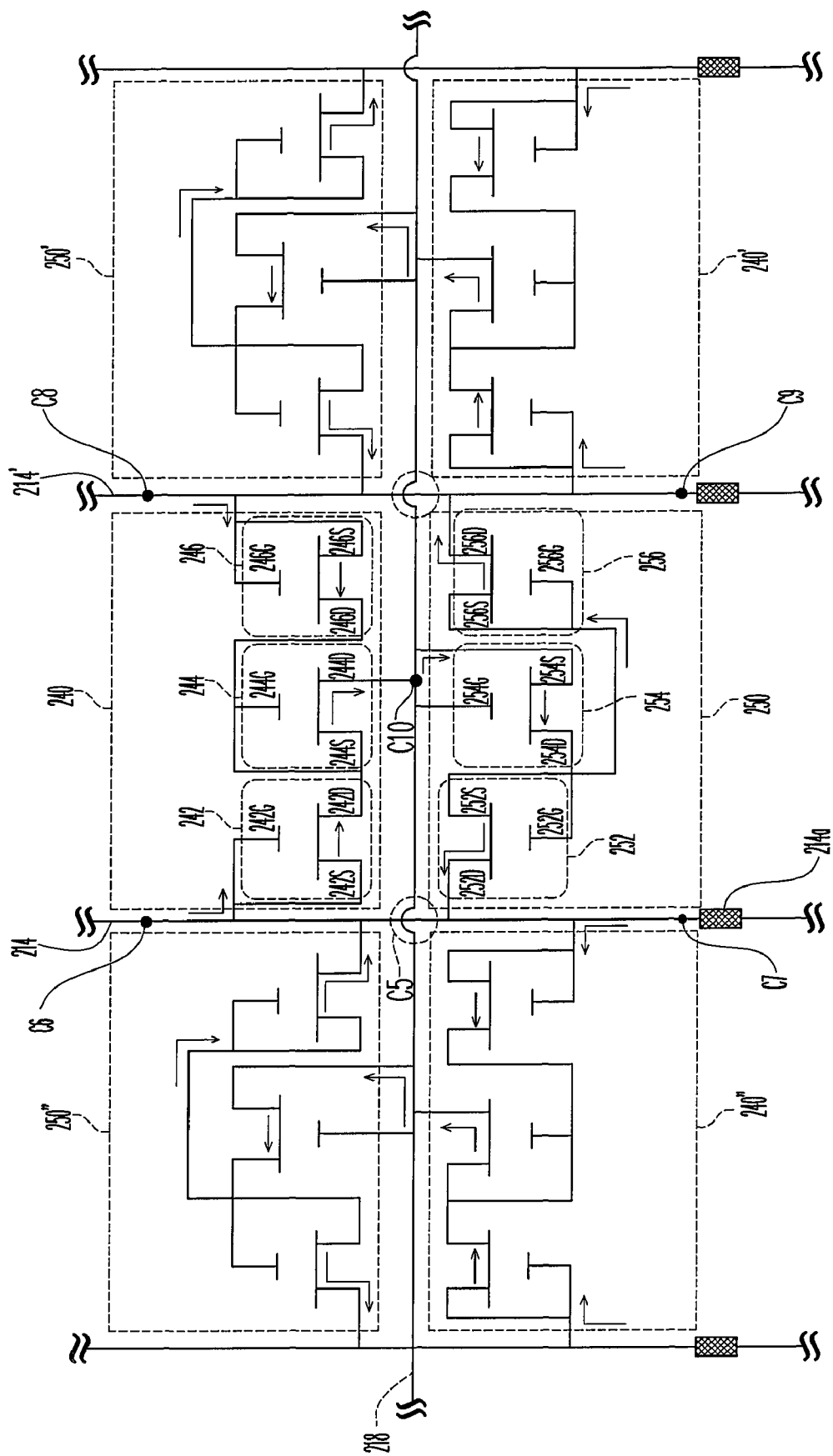
FIG. 5 is a schematic circuit diagram of the ESD protection circuit according to the second embodiment of the present invention.

FIG. 4 is a schematic view of the active device array substrate according to the second embodiment of the present invention. FIG. 5 is a schematic circuit diagram of the ESD protection circuit according to the second embodiment of the present invention. Referring to FIGS. 4 and 5 together, the first ESD protection circuit 240 and the second ESD protection circuit 250 of the present invention are electrically connected between two adjacent first conductive lines 214, 214'. It should be noted that the first ESD protection circuit 240 and the second ESD protection circuit 250 are electrically connected to tow sides of the lead line 218 respectively and are electrically connected to each other via the lead line 218.

It should be noted that, the relative position between the first ESD protection circuit 240' (as shown in FIG. 5) and the second ESD protection circuit 250' of the next group is opposite to the relative position between the first ESD protection circuit 240 and the second ESD protection circuit 250. In particular, the first ESD protection circuit 240 comprises a first active device 242, a second active device 244, and a third active device 246. The first active device 242 comprises a first source 242S, a first drain 242D, and a first gate 242G. The first source 242S and the first gate 242G are electrically connected to the first conductive line 214. In addition, the second active device 244 comprises a second source 244S, a second drain 244D, and a second gate 244G. The second source 244S and the second gate 244G are electrically connected to the first drain 242D, and the second drain 244D is electrically connected to the lead line 218.

Further, the third active device 246 of the present invention comprises a third source 246S, a third drain 246D, and a third gate 246G. The third drain 246D is electrically connected to the second gate 244G, and the third source 246S and the third gate 246G are electrically connected to the next first conductive line 214'.

In particular, when the ESD phenomenon occurs at C6 of the first conductive line 214 (adjacent to one end of the display region A), the high voltage instantly generated by ESD turns on the first active device 242 and the second active device 244 sequentially. After that, the electrostatic charges are further dispersed to the lead line 218 by the second active device 244. It should be especially noted that when the ESD phenomenon occurs at C8 of the next first conductive line 214', the high voltage instantly generated by ESD turns on the third active device 246 and the second active device 244 sequentially. After that, the electrostatic charges are further dispersed to the lead line 218 by the second active device 244.

It should be noted that when the ESD phenomenon occurs at C7 of the first conductive line 214 (adjacent to one end of the first pad 214a), the electrostatic charges are dispersed by the first ESD protection circuit 240" of the preceding group. Further, when the ESD phenomenon occurs at C9 of the first conductive line 214', the electrostatic charges are dispersed by the first ESD protection circuit 240' of the next group.

In another aspect, the second ESD protection circuit 250 of the present invention corresponding to the first ESD protection circuit 240 is disposed at one side of the lead line 218, and the second ESD protection circuit 250 is electrically connected between two adjacent first conductive lines 214 and 214'. The second ESD protection circuit 250 comprises a fourth active device 252, a fifth active device 254, and a sixth active device 256. The fourth active device 252 comprises a fourth source 252S, a fourth drain 252D, and a fourth gate 252G. The fourth drain 252D is electrically connected to the first conductive line 214. In addition, the fifth active device 254 comprises a fifth source 254S, a fifth drain 254D, and a fifth gate 254G. The fourth source 252S and the fourth gate 252G are electrically connected to the fifth drain 254D, and the fifth source 254S and the fifth gate 254G are electrically connected to the lead line 218.

Furthermore, the sixth active device 256 comprises a sixth source 256S, a sixth drain 256D, and a sixth gate 256G. The sixth source 256S and the sixth gate 256G are electrically connected to the fifth drain 254D, and the sixth drain 256D is electrically connected to the next first conductive line 214'. In particular, when the ESD phenomenon occurs at C10 of the lead line 218, the electrostatic charges are respectively dispersed to the fourth active device 252 and the sixth active device 256 through the fifth active device 254. After that, the electrostatic charges are respectively dispersed to the first conductive line 214 and the next first conductive line 214' through the fourth active device 252 and the sixth active device 256.

As the first ESD protection circuit 240 and the second ESD protection circuit 250 of the present invention are connected between two adjacent first conductive lines 214, 214', more electrostatic dispersion paths are provided, thereby effectively preventing the devices on the active device array substrate 200a from being damaged by ESD. Particularly, if the short caused by ESD occurs to one active device in the first ESD protection circuit 240, the other undamaged active device can still operate normally. Therefore, the first ESD protection circuit 240 does not fail completely. The second ESD protection circuit 250 of the present invention has the same advantages.

Definitely, it is known to those of ordinary skills in the art that the first ESD protection circuit 240 and the second ESD protection circuit 250 can also be disposed at the second conductive line 216 (as shown in FIG. 4), so as to further enhance the ESD protection function of the active device array substrate 200a.

The Third Embodiment

Figure 6:
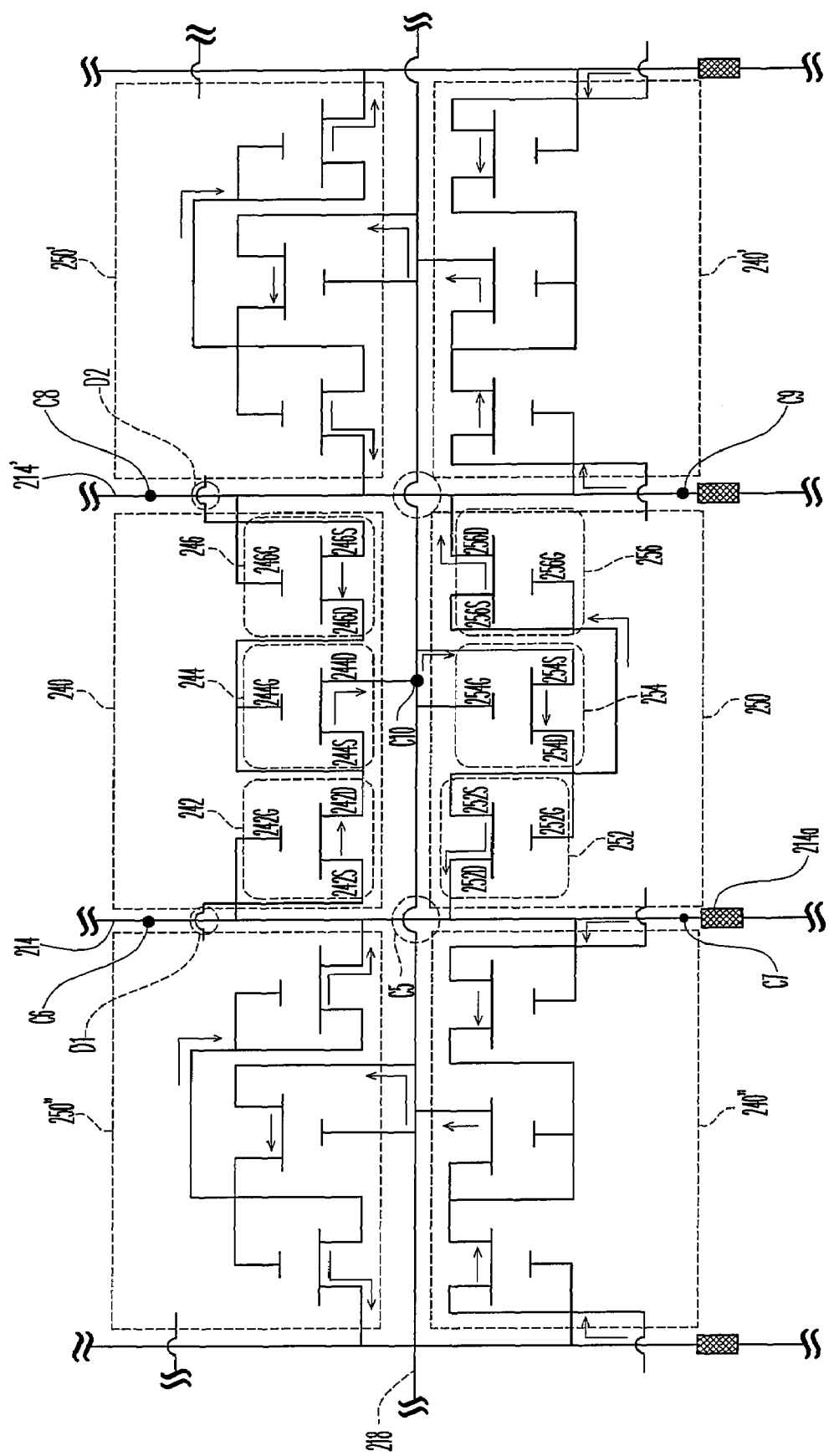
FIG. 6 is a schematic view of the cross line portion according to the third embodiment of the present invention.

The third embodiment is similar to the second embodiment, and the major difference lies in that in the present embodiment, the first source of the first active device extends crossing the first conductive line, so as to form a first cross line portion. FIG. 6 is a schematic view of the cross line portion according to the third embodiment of the present invention. Referring to FIG. 6, the first source 242S of the first active device 242 extends crossing the first conductive line 214, so as to form a first cross line portion D1.

It should be especially noted that in the present embodiment, the first conductive lines 214 are taken as the scan lines, and the active device adopts a bottom gate structure for illustration. The scan lines are constituted of the so-called first metal layer (metal 1), and the first source 242S is constituted of the so-called second metal layer (metal 2). In practice, the first cross line portion D1 can be formed by the second metal layer (the first source 242S) extending to above the first metal layer (the first conductive line 214). Definitely, it is known to those of ordinary skills in the art that if the active device is of a top gate structure, the first cross line portion D1 can be formed by the second metal layer (the first source 242S) extending to below the first metal layer (the first conductive line 214).

It should be noted that the first cross line portion D1 easily induces the electrostatic discharging here, thus achieving the purpose of consuming the energy of static electricity. Though the short caused by ESD may occur to the first conductive line 214 and the first source 242S in the first cross line portion D1, the first source 242S must be electrically connected to the first conductive line 214 (scan line). Therefore, the short of the first conductive line 214 and the first source 242S in the first cross line portion D1 does not cause the negative effect to the active device array substrate.

In order to further enhance the ESD protection function of the active device array substrate, the third source 246S of the third active device 246 extends crossing the next first conductive line 214', so as to form a second cross line portion D2. The second cross line portion D2 of the present invention also has the function of inducing the ESD, so as to achieve the purpose of consuming the energy of the static electricity.

Figure 7:
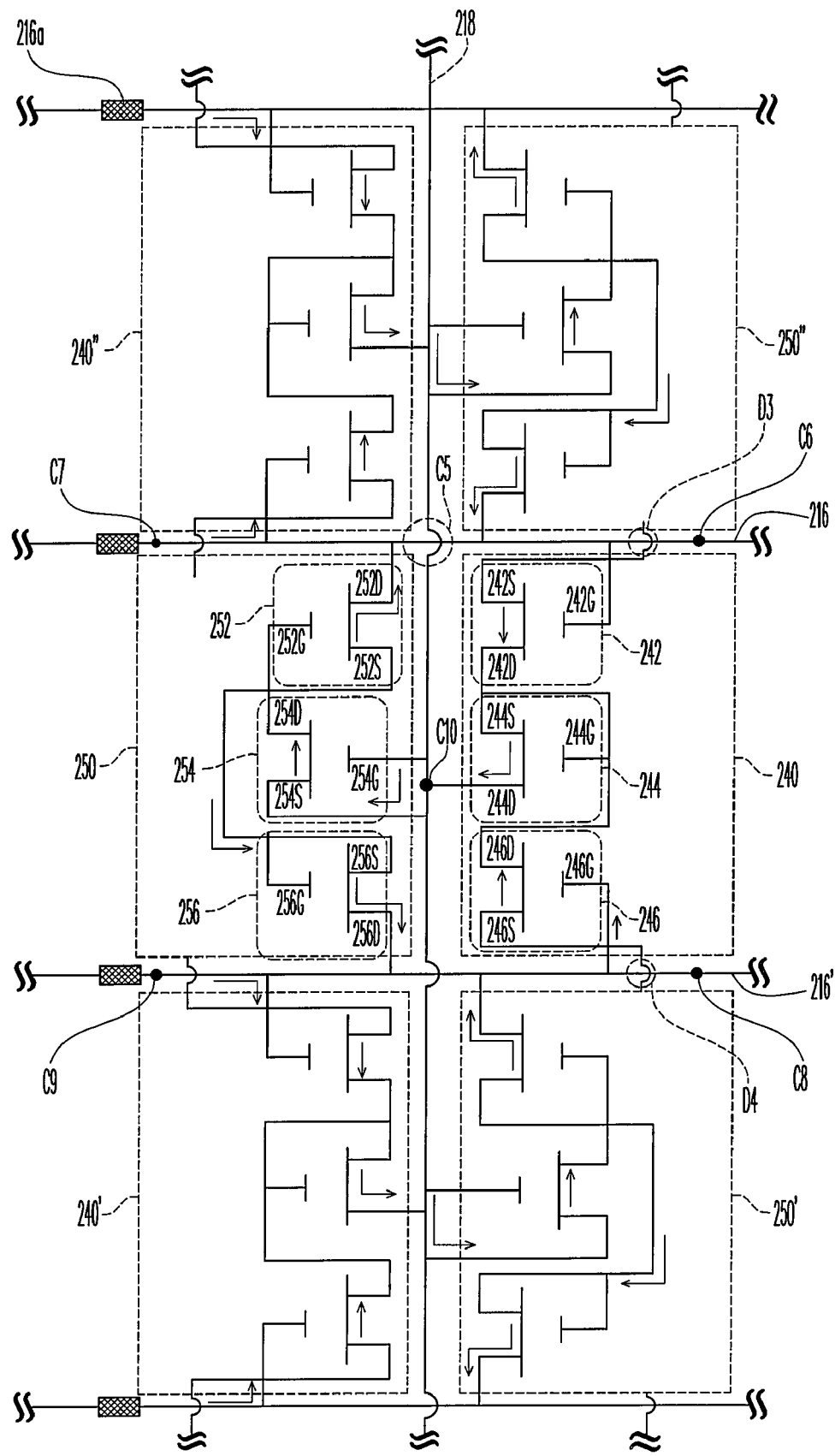
FIG. 7 is a schematic view of another cross line portion according to the third embodiment of the present invention.

FIG. 7 is a schematic view of another cross line portion according to the third embodiment of the present invention. Referring to FIG. 7, it should be noted that the cross line portion of the present invention can also be disposed at the second conductive line. The second conductive line 216 of the present embodiment is a data line formed by the so-called second metal layer (metal 2). Therefore, the third cross line portion D3 of the present invention can be formed by the second conductive line 216 (the second metal layer) crossing the extending portion of the first gate 242G (the first metal layer). Further, the fourth cross line portion D4 can also be formed by the next second conductive line 216' (the second metal layer) crossing the expending portion of the third gate 246G (the first metal layer).

In view of the above, the active device array substrate of the present invention has the first ESD protection circuit and the second ESD protection circuit respectively disposed at two sides of the lead line, such that the portion of the lead line crossing the first conductive line is located between the first ESD protection circuit and the second ESD protection circuit. Therefore, when the ESD phenomenon occurs, the electrostatic charges first flow through the first ESD protection circuit or the second ESD protection circuit, and then through the portion of the lead line crossing the first conductive line, so as to effectively prevent the portion of the lead line crossing the first conductive line from being directly impacted by ESD. The first ESD protection circuit and the second ESD protection circuit of the present invention are connected between two adjacent first conductive lines, and are connected to each other through the lead line, thereby effectively increasing the static dispersion paths on the active device array substrate. The first, second, third and fourth cross line portions of the present invention can actively induce the static electricity to discharge herein, thereby achieving the purpose of consuming the energy of the static electricity without negatively affecting the active device array substrate.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. An active device array substrate, having a display region and a peripheral circuit region outside the display region, the active device array substrate comprising:
    a substrate;
    a plurality of pixel units, disposed on the substrate in an array and inside the display region;
    a plurality of first conductive lines, disposed inside the peripheral circuit region on the substrate, the first conductive lines extending from the peripheral circuit region and being electrically connected to the pixel units;
    a plurality of second conductive lines, disposed inside the peripheral circuit region on the substrate, the second conductive lines extending from the peripheral circuit region and being electrically connected to the pixel units;
    a lead line, disposed inside the peripheral circuit region, crossing the first conductive lines thus defining two sides;
    at least one first electrostatic discharge (ESD) protection circuit, disposed at one side of the lead line, and electrically connected between any one of the first conductive lines and the lead line; and
    at least one second ESD protection circuit corresponding to the first ESD protection circuit, being disposed at the other side of the lead line, and electrically connected to the same first conductive line that the first ESD protection circuit is electrically connected to, wherein the second ESD protection circuit is electrically connected to the first ESD protection circuits via the lead line,
    wherein the first ESD protection circuit is electrically connected between two adjacent first conductive lines, the first ESD protection circuit comprising:

a first active device, comprising a first source, a first drain, and a first gate, wherein the first source and the first gate are electrically connected to the first conductive line;

a second active device, comprising a second source, a second drain, and a second gate, wherein the second source and the second gate are electrically connected to the first drain, and the second drain is electrically connected to the lead line; and a third active device, comprising a third source, a third drain, and a third gate, wherein the third drain is electrically connected to the second gate, and the third source and the third gate are electrically connected to the next first conductive line.

2. The active device array substrate as claimed in claim 1, wherein the second ESD protection circuit is electrically connected between two adjacent first conductive lines, the second ESD protection circuit comprising:

a fourth active device, comprising a fourth source, a fourth drain, and a fourth gate, wherein the fourth drain is electrically connected to the first conductive line;

a fifth active device, comprising a fifth source, a fifth drain, and a fifth gate, wherein the fourth source and the fourth gate are electrically connected to the fifth drain, and the fifth source and the fifth gate are electrically connected to the lead line; and sixth active device, comprising a sixth source, a sixth drain, and a sixth gate, wherein the sixth source and the sixth gate are electrically connected to the fifth drain, and the sixth drain is electrically connected to the next first conductive line.

3. The active device array substrate as claimed in claim 1, wherein the first conductive lines are scan lines and the second conductive lines are data lines.

4. The active device array substrate as claimed in claim 3, wherein the first source of the first active device extends crossing the first conductive line, so as to form a first cross line portion.

5. The active device array substrate as claimed in claim 3, wherein the third source of the third active device extends crossing the next first conductive line, so as to form a second cross line portion.

6. The active device array substrate as claimed in claim 1, wherein the first conductive lines are data lines and the second conductive lines are scan lines.

7. The active device array substrate as claimed in claim 6, wherein the first gate of the first active device extends and is crossed by the first conductive line, so as to form a third cross line portion.

8. The active device array substrate as claimed in claim 6, wherein the third gate of the third active device extends and is crossed by the next first conductive line, so as to form a fourth cross line portion.

* * * * *